US 6,572,320 B2

(12) United States Patent  (10) Patent No.: US 6,572,320 B2
Davis  (45) Date of Patent: Jun. 3, 2003

(54) ROBOT FOR HANDLING WORKPIECES IN AN AUTOMATED PROCESSING SYSTEM

(75) Inventor: Jeffry Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/907,523

(22) Filed: Jul. 16, 2001

(65) Prior Publication Data

US 2002/0051700 A1 May 2, 2002

Related U.S. Application Data

(63) Continuation-in-part of application No. 09/612,009, filed on Jul. 7, 2000, which is a continuation-in-part of application No. 09/274,511, filed on Mar. 23, 1999, now Pat. No. 6,279,724, which is a continuation-in-part of application No. 09/112,259, filed on Jul. 8, 1998, now Pat. No. 6,273,110, which is a continuation-in-part of application No. 08/994,737, filed on Dec. 19, 1997, now Pat. No. 6,447,232, which is a continuation-in-part of application No. 08/851,480, filed on May 5, 1997, now abandoned.

(51) Int. Cl.[7] .................................................. B25J 15/08
(52) U.S. Cl. ..................... 414/217; 414/941; 294/119.1
(58) Field of Search ................................ 414/941, 217; 294/119.1

(56) References Cited

U.S. PATENT DOCUMENTS

| 4,639,028 A | * | 1/1987 | Olson ........................ 294/34 |
| 4,735,452 A | * | 4/1988 | Nemoto .................... 294/119.1 |
| 5,022,695 A |   | 6/1991 | Ayers |
| 5,133,635 A |   | 7/1992 | Malin et al. |
| 5,404,894 A |   | 4/1995 | Shiraiwa |
| 5,460,478 A | * | 10/1995 | Akimoto et al. ............ 414/786 |
| 5,590,996 A |   | 1/1997 | Thompson et al. |
| 5,700,046 A | * | 12/1997 | Van Doren et al. ....... 294/119.1 |
| 5,988,971 A | * | 11/1999 | Fossey et al. ................ 414/416 |
| 6,279,724 B1 | * | 8/2001 | Davis ....................... 198/465.2 |
| 6,322,119 B1 | * | 11/2001 | Schmidt et al. .......... 294/103.1 |
| 6,447,232 B1 | * | 9/2002 | Davis et al. ............. 414/217.1 |

* cited by examiner

Primary Examiner—Steven A. Bratlie
(74) Attorney, Agent, or Firm—Perkins Coie LLP

(57) ABSTRACT

An automated workpiece processing system has a transfer robot including an end effector having arms which move linearly towards each other to pick up a workpiece. Each arm has two workpiece contactors for engaging the edges of the workpiece. The contactors are positioned equally distant from the workpiece edges. The arms are moved linearly together, while they remain parallel to each other. The contactors contact the edges of the workpiece without causing sliding or displacement of the workpiece. Transfer robot movement or pre-positioning of the end effector is minimized, expediting handling of workpieces within the automated system.

19 Claims, 9 Drawing Sheets

ROBOT FOR HANDLING WORKPIECES IN AN AUTOMATED PROCESSING SYSTEM

This application is a Continuation-in-Part of U.S. patent application Ser. No. 09/612,009, filed Jul. 7, 2000, and now pending, which is a Continuation-in-Part of U.S. patent application Ser. No. 09/274,511, filed Mar. 23, 1999 now U.S. Pat. No. 6,279,724, which is a Continuation-in-Part of U.S. patent application Ser. No. 09/112,259, filed Jul. 8, 1998, now U.S. Pat. No. 6,273,110, which is a Continuation-in-Part of U.S. patent application Ser. No. 08/994,737, filed Dec. 19, 1997, now U.S. Pat. No. 6,447,232, which is a Continuation-in-Part of U.S. patent application Ser. No. 08/851,480, filed May 5, 1997 and now abandoned. Priority to these applications is claimed under 35 USC §120, and these applications are incorporated herein by reference.

The field of the invention is automated workpiece processing systems, used for processing workpieces, such as semiconductor wafers, hard disk media, substrates, optical materials, as well as other workpieces formed from a substrate upon which microelectronic circuits or components, data storage elements or layers, and/or micro-mechanical elements are or can be formed. These and similar materials generally requiring very low levels of contamination, are collectively referred to here as "wafers" or "workpieces".

BACKGROUND OF THE INVENTION

Computers, televisions, telephones and other electronic product contain large numbers of essential electronic semiconductor devices. To produce electronic products, hundreds or thousands of semiconductor devices are manufactured in a very small space, using lithography techniques on semiconductor substrates, such as on silicon wafers or other substrates. Due to the extremely small dimensions involved in manufacturing semiconductor devices, contaminants on the semiconductor substrate material, such as particles of dust, dirt, paint, metal, etc. lead to defects in the end products.

Existing automated semiconductor processing system use robots, carriers, rotors, and other devices, to move and process wafers. Many automated semiconductor processing systems use centrifugal wafer processors, which spin the wafers in a rotor at high speed, while spraying or otherwise applying process fluids and/or gases onto the wafers. The rotors typically hold a batch of wafers in a parallel array. Other types of processors have a fixed or rotating workpiece supports holding workpieces within a chamber. Process fluids, such as liquids, gases or vapors are introduced into the chamber to process the workpieces. Typically, automated semiconductor processing system have robots which move workpieces between different stations or locations, as described, for example, in U.S. Pat. Nos. 5,544,421 and 5,664,337, incorporated herein by reference. In some systems the robots handle the workpieces directly, generally by picking them up or holding the workpiece at the edges of the workpiece. Other systems have robots which handle workpieces using suction cups or similar devices on the top or bottom surface of the workpiece.

These types of robots and handling techniques have certain disadvantages. Micro-electronic devices or other components necessary in the ultimate product manufactured from the workpiece (e.g., micro-electronic circuits) are created on the front and/or back surfaces of the workpiece. Consequently, handling the workpiece on these surfaces can lead to defects and reduced yield in the manufacturing process. As a result, handling workpieces by their edges is preferred, because no components are formed at the edges. However, handling workpieces at the edges requires precise positioning of the robot for pick up and placement of a workpiece. In addition, as the workpieces are typically fragile, they must be handled gently by the robot. Rubbing or scraping of a workpiece, or rough handling, may also result in damage or the creation of particles which may settle on a workpiece, resulting in defects.

Robots which handle workpieces by their edges have been used, with varying degrees of success. However, these robots require precise pre-positioning, before making contact with the workpiece. While the added time required for pre-positioning a robot for a single workpiece pick up operation may be relatively little, the added time for this positioning and movement, over hundreds or thousands of workpiece pick up cycles, becomes substantial.

Accordingly, an improved robot and workpiece handling methods are needed for use in an automated workpiece processing system.

SUMMARY OF THE INVENTION

A workpiece handling robot has now been invented for picking up and handling workpieces by their edges in a quick and direct way, and without the need for extensive time-consuming precise alignment or pre-positioning of the robot relative to the workpiece. In a first aspect, an automated processing system has a robot at a transfer station. The robot withdraws workpieces from a container at a docking station and moves the workpieces to a carrier. The robot has an end effector or hand having first and second arms or tines. Each arm has a workpiece contact. The robot is moved so that the workpiece is between the arms. The arms are then brought together, with the workpiece contacts engaging the edges of the workpiece. The arms preferably remain parallel at all times. The contacts on the arms preferably move linearly to contact and pick up the workpiece. Extensive robot pre-positioning movements, to align the robot with the workpiece, are avoided. In addition, the workpiece contacts preferably contact the workpiece edges nearly simultaneously. This reduces or avoids sliding movement of the workpiece, which can cause damage or contamination to the workpiece.

In a second aspect, the first and second arms are driven by a linkage which moves the arms simultaneously in equal and opposite directions. This provides for automatic precise four-point contact between the robot and the workpiece, resulting in simplified and expedited handling.

In a third aspect, an actuator drives the linkage moving the first and second arms. The limited amount of force exerted by the actuator on the linkage correspondingly limits the force which the workpiece contacts on the arms may exert on the workpiece. As a result, gentle handling of the workpiece is automatically provided.

In a fourth aspect, sensors are provided on the robot, to detect whether the robot has successfully picked up a workpiece. This feature reduces potential for damage to workpieces, by signaling the robot controller to stop or reverse robot movement, when appropriate.

Other advantageous features will also be shown and described. The invention resides as well in subcombinations of the components and methods described. It is an object of the invention to provide an improved robot for handling workpieces in an automated workpiece processing system.

BRIEF DESCRIPTION OF THE DRAWINGS

In the drawings, wherein the same reference number indicates the same element, in all of the views.

DETAILED DESCRIPTION OF THE DRAWINGS

Figure 1:
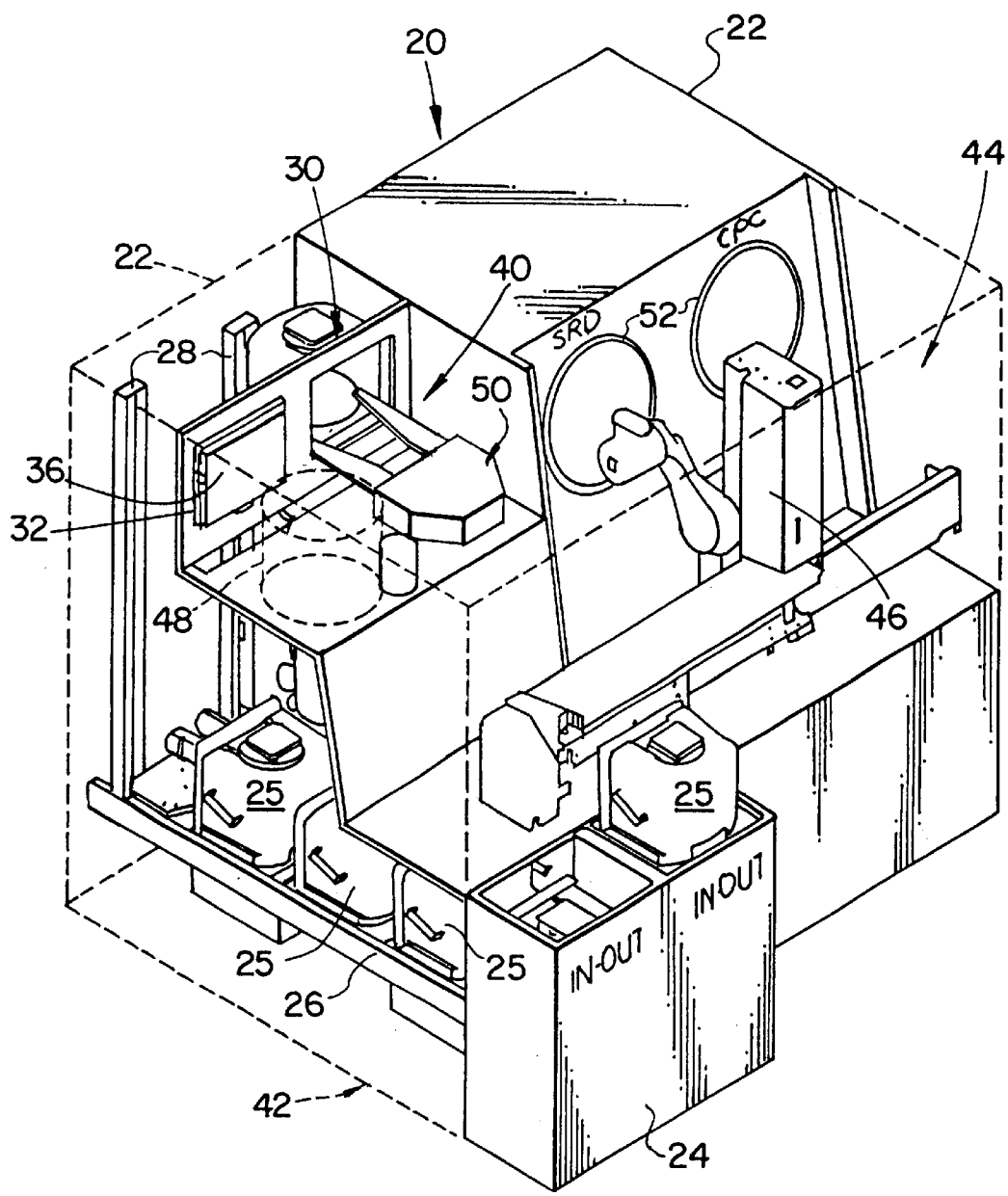
FIG. 1 is a perspective view of an automated processing system, with enclosure walls removed for purpose of illustration.
Figure 2:
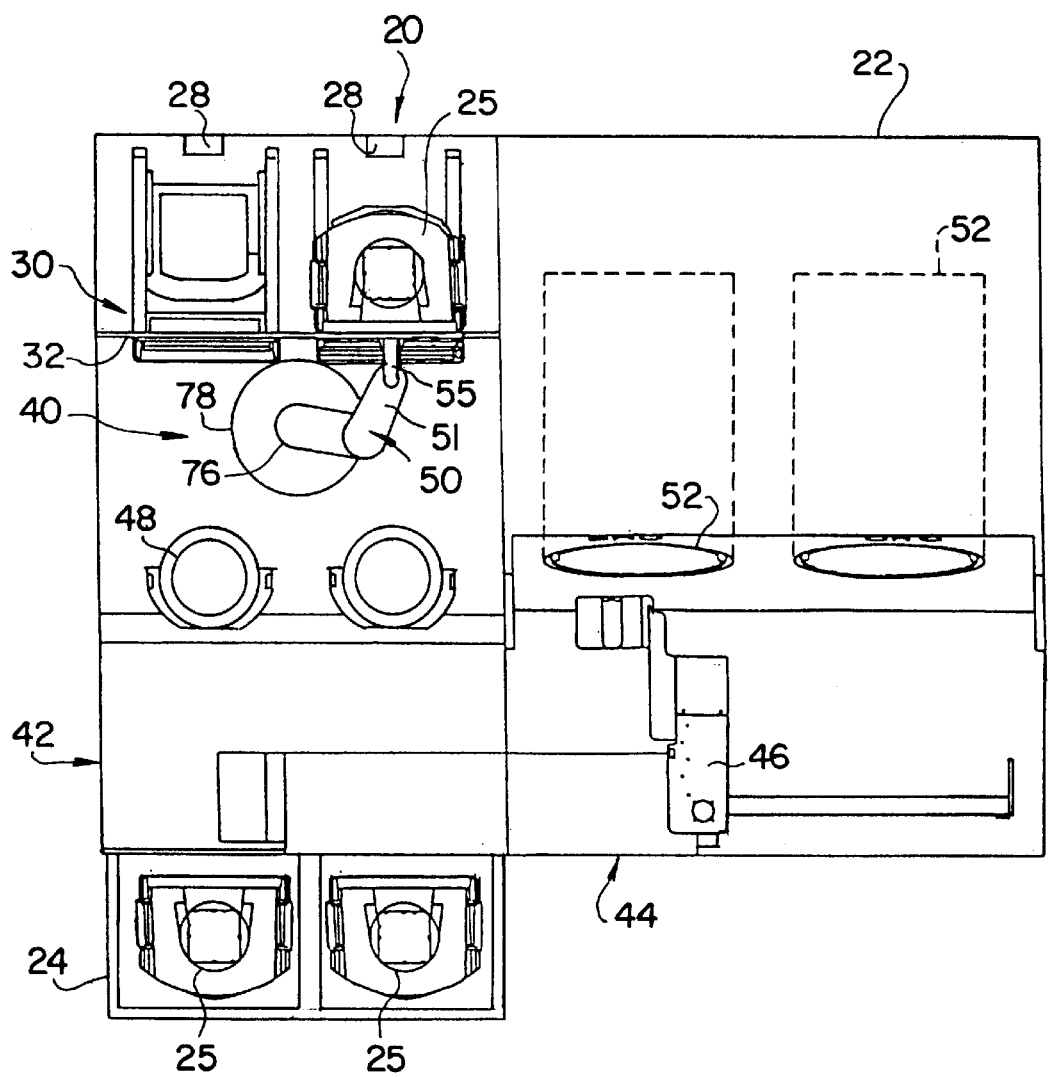
FIG. 2 is a plan view of the system of FIG. 1, with enclosure walls removed for purposes of illustration.
Figure 3:
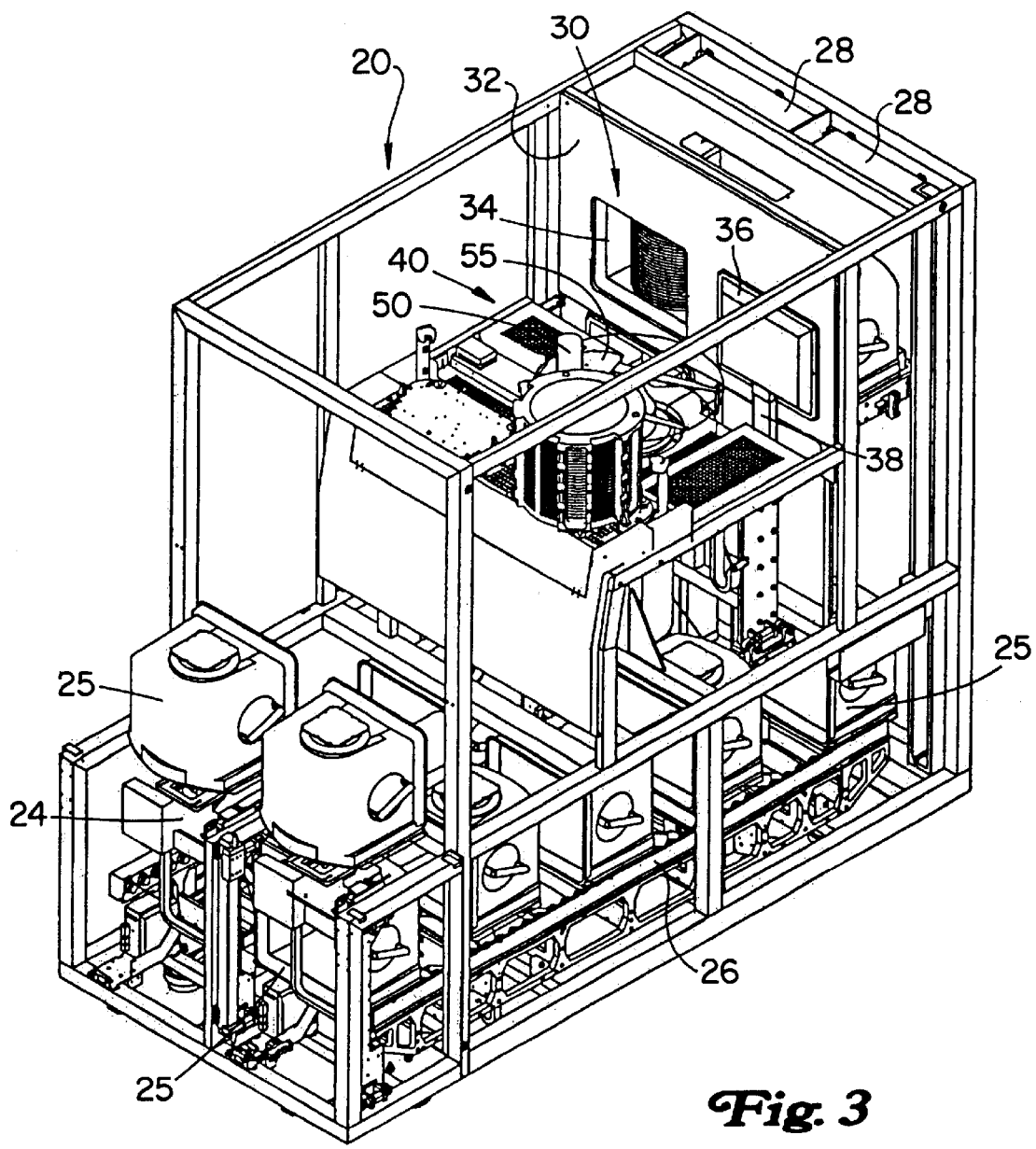
FIG. 3 is a front and right side perspective view of the interface section shown in FIGS. 1 and 2, with enclosure walls removed for purposes of illustration.

Turning now in detail to the drawings, as shown in FIGS. 1 and 2, an automated processing system 20 has an interface section 42 along side of a process section 44 within an enclosure 22. Workpieces 35 within a container, such as an FOUP box or container, are placed onto an input/output station 24, and then moved into an indexer 26 within the enclosure 22. The indexer 26 temporarily stores the workpieces, either waiting for processing, or waiting for removal from the processing system 20. This allows the processing system 20 to run continuously. Elevators 28 at the back end of the indexer 26 move boxes 25 vertically between the indexer 26 and a docking station 30. At the docking station 30, the boxes 25 are placed or sealed against a wall 32. A cover 36 over an opening 34 in the wall 32 is removed by a cover actuator 38. A transfer robot 50 at a transfer station 40 removes workpieces 35 from the boxes 25 and places them into a carrier 48. A process robot 46 carries the loaded carrier 48 to a processor 52.

Processed workpieces move in the reverse sequence, with the process robot 46 carrying them in a carrier 48 back to the transfer station 40, where the transfer robot 50 removes workpieces 35, one at a time from the carrier 48 and places them back into a box 25. The design and operation of the processing system is generally described in U.S. patent application Ser. Nos. 09/612,009; 09/611,709; and 09/735,154, all incorporated herein by reference.

Referring to FIG. 2, the transfer robot 50 has an end effector or hand 55 attached to an articulated arm 51 of a cylinder robot 78, such as, for example, a Gencobot telescopic robot available from Genmark Automation, Sunnyvale, Calif., U.S.A. The cylinder robot 78 can telescope vertically and drive the articulated arm 51, to move the end effector 55 in multiple degrees of freedom, as is well known.

Figure 5:
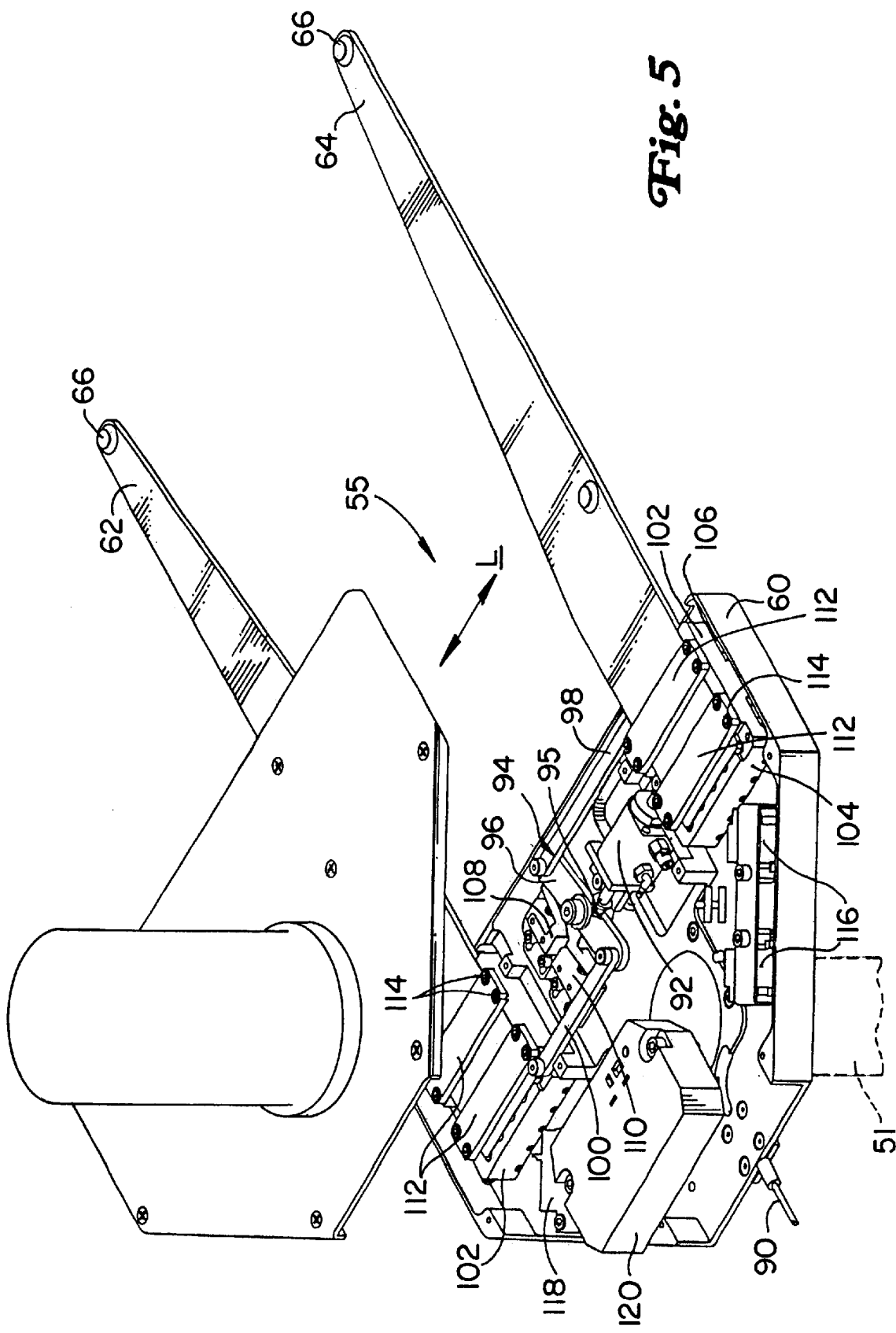
FIG. 5 is an exploded perspective view of the end effector of the robot shown in FIGS. 1 and 2.

Turning to FIG. 5, the end effector 55 has a first arm or tine 62 and a second arm or tine 64 extending out of a housing 60. Each of the arms 62 and 64 has two inserts or workpiece contacts 66. The arms 62 and 64 are moveable from an open position, shown in FIG. 9, to a closed position, shown in FIG. 10. With the arms 62 and 64 in the closed position, the inserts 66 are geometrically positioned at the corners of a square 65. With the arms in the open position, the inserts 66 are geometrically located at the corners of a rectangle 67, having a top and bottom A and B slightly longer than the sides C.

Figure 11:
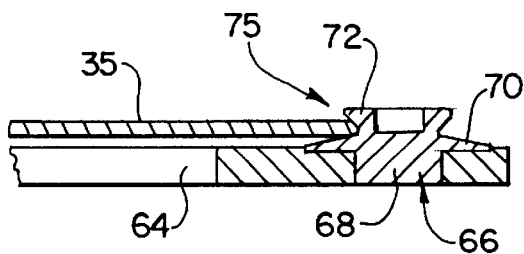
FIG. 11 is a section view taken along line 11—11 of FIG. 10.

Referring to FIG. 11, each of the inserts 66 has a base 68 secured into an arm 62 or 64. An angled annular insert lip 70 extends radially outwardly from the base 68. A cap 72 attached to the lip 70 forms a groove or slot 75, with the lip 70, adapted to engage the edge of a workpiece. The inserts are preferably an electrically conducting material. Wires connect each of the inserts 66 to an amplifier 118 in the housing 60. The amplifier 66 is connected to a system controller/computer through the cylinder robot 78.

Referring to FIGS. 5–8, the first arm 62 is attached to a first slide block 102 by clamp plates 112 and fasteners 114. Similarly, the second arm 64 is attached to a second slide block 104 with clamp plates 112 and fasteners 114. Both slide blocks 102 and 104 are slidable on guide rails 106 laterally, in the direction L shown in FIG. 5. The slide blocks 102 and 104, and the arms 62 and 64 attached to them can move only together and away from each other, in direction L. A first link 100 is pivotably attached to the first slide block 102 and to a first end of a cross arm 96. A second link 98 is similarly pivotably attached to the second slide block 104 and to a second end of the cross arm 96, opposite from the first link 100. The cross arm 96 is pivotably supported on the housing 60. An actuator 92 has a piston attached at one side of the cross arm 96 through a clevis 95. The actuator 92 is preferably a pneumatic actuator connected to pneumatic valves 116 within the housing 60. Compressed air or gas lines from a compressed gas source in the processing system 20 extend in or on the cylinder robot 78 and connect to the valves 116 in the housing 60 through a supply line 90. Several of the lines connecting the valves 116 to the actuator 92 or supply line 90 are omitted for clarity of illustration.

The actuator 92 alternatively may be electrically powered. An optical workpiece mapping sensor 120 is optionally also provided in the housing 60.

Figure 4:
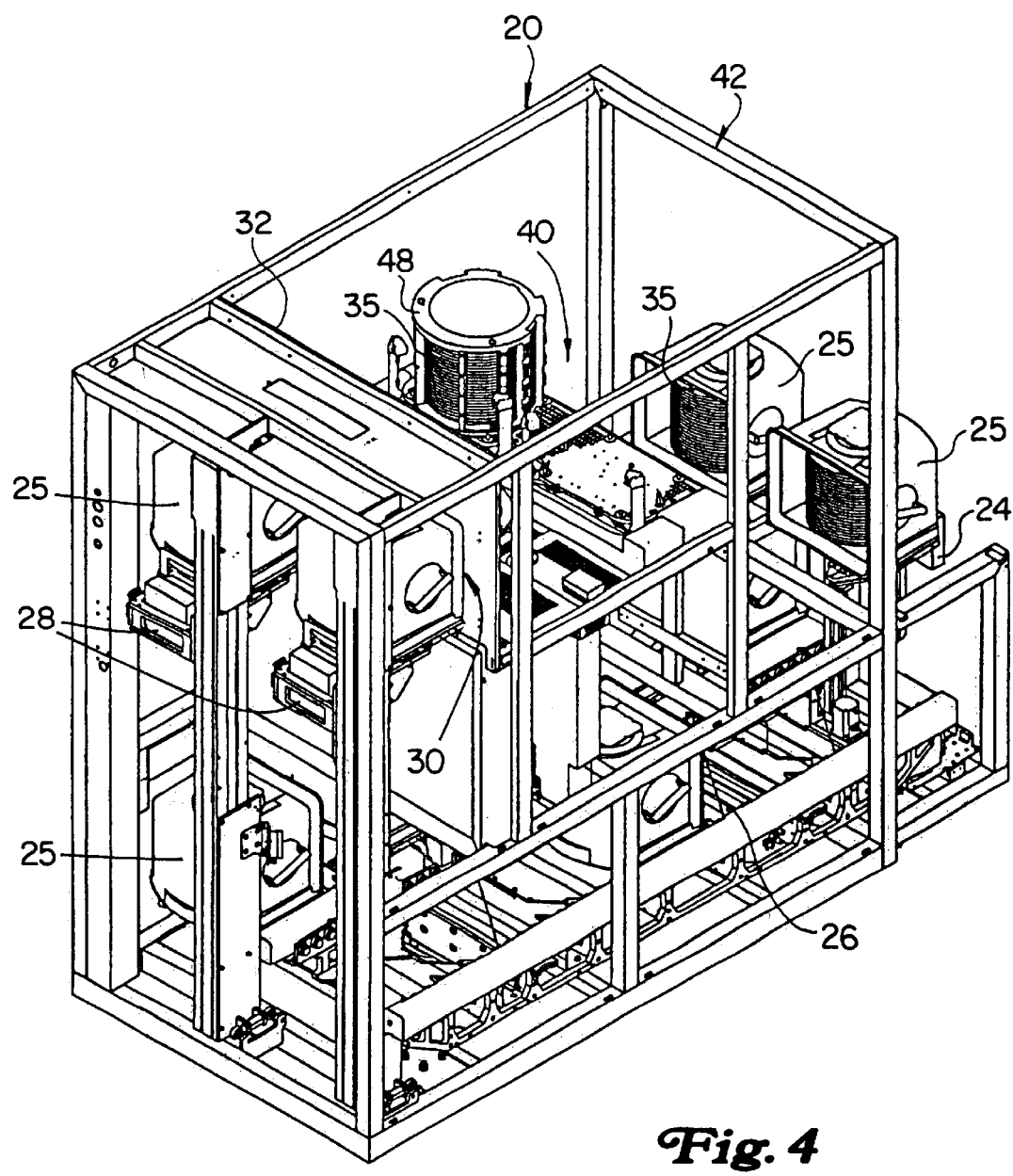
FIG. 4 is a rear and left side perspective view thereof.

The cross arm 96, first arm 100 and second arm 98 form a parallel acting linkage 94. Referring to FIGS. 4 and 5, when the actuator 92 extends, the cross arm 96 is turned clockwise. This moves the first slide block 102 and the second slide block 104 and the arms 62 and 64 attached to the slide blocks 102 and 104, away from each other, with equal and opposite movement.

Figure 9:
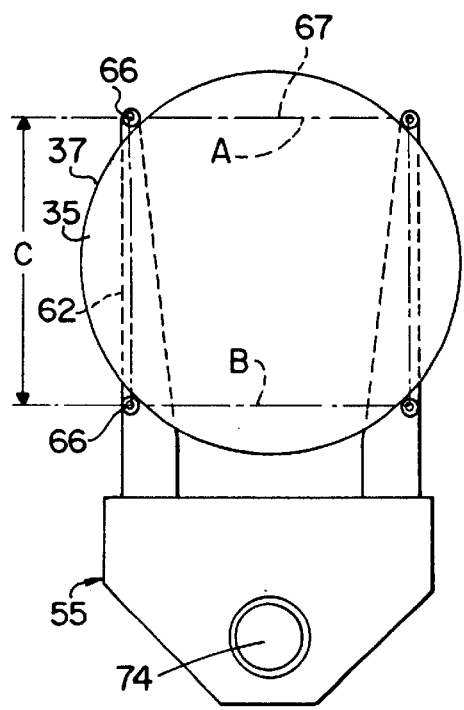
FIG. 9 is a plan view showing the end effector of FIGS. 5–8 positioned to engage or pick up a workpiece.
Figure 10:
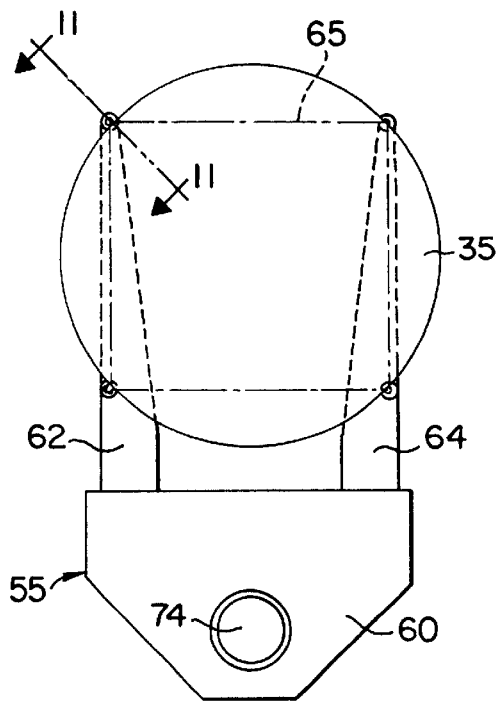
FIG. 10 is a plan view of the end effector in FIG. 9 holding a workpiece.

Referring to FIG. 9, in use, the cylinder robot 78 moves the end effector 55 so that the arms 62 and 64 are underneath the workpiece 35 to be picked up. The inserts 72 are all equally distant from the edge 37 of the workpiece 35. The actuator 92 is energized to move the cross arm 96 counterclockwise (in FIGS. 5 and 6). This movement brings the arms and the inserts 66 towards each other in a straight line. The inserts 66 accordingly move into contact with the edges 37 of the workpiece 35 and contact the edge 37 simultaneously, or near simultaneously. Consequently, sliding of the workpiece 35 during engagement by the end effector 55 is reduced or eliminated. The actuator 92 exerts nominal force, so that the workpiece 35 is handled gently.

The inserts 66 may form a capacitive sensor. As the inserts 66 contact the workpiece 35, a change in capacitance is detected, amplified by the amplifier 118, and a corresponding signal is provided to the system controller. This change in capacitance verifies the presence of the wafer edge in contact with the inserts 66. If the end effector 55 is moved to pick up a workpiece 35, and the arms 62 and 64 move in to the position shown in FIG. 10, without a change in capacitance detected at each of the inserts 66, the system controller or computer may determine that the workpiece 35 is not properly engaged by the end effector 55, that a workpiece 35 is missing from an intended position, or that another condition exists which must be resolved before further workpiece movements are initiated.

Figure 6:
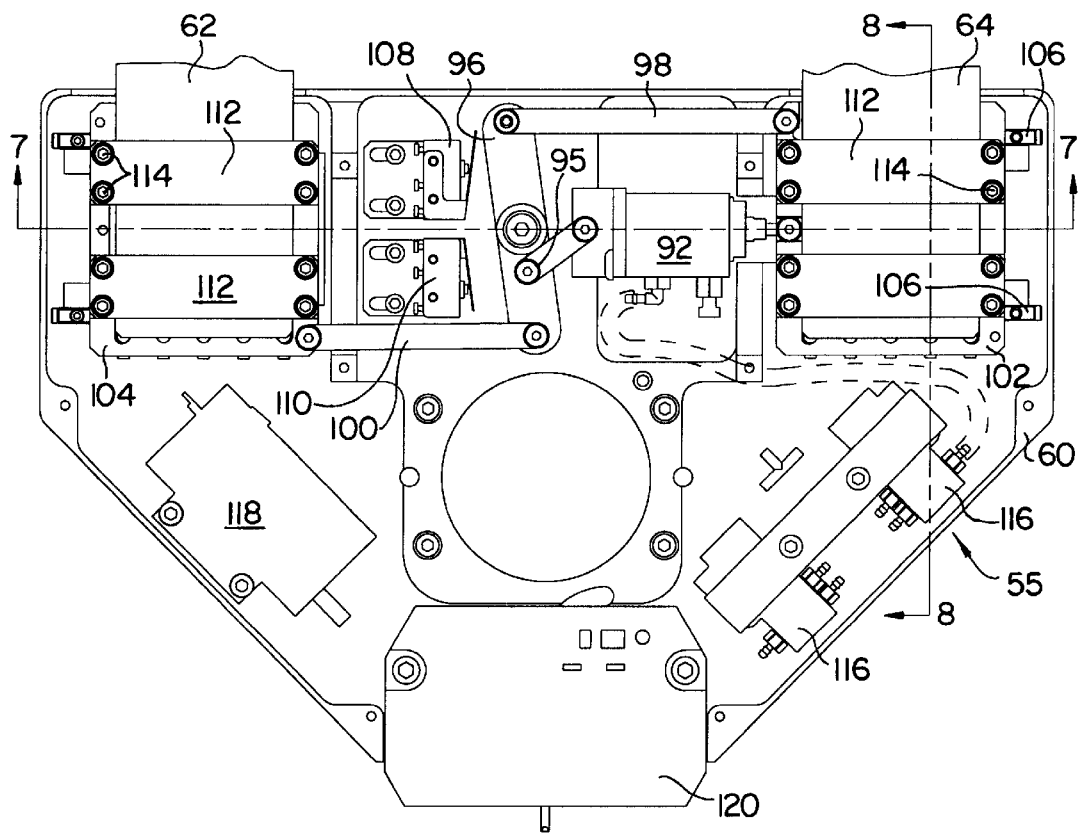
FIG. 6 is a top view of the end effector shown in FIG. 5, with the cover removed.
Figure 7:
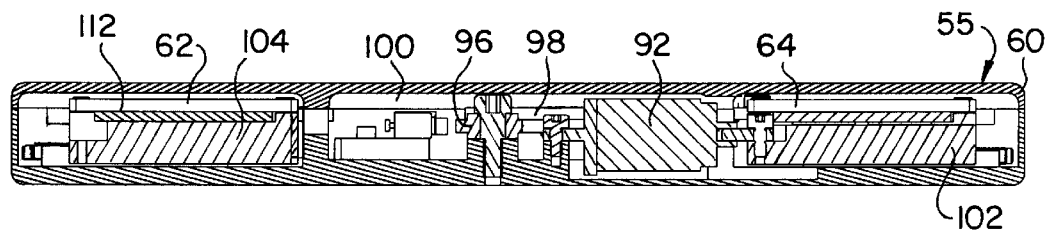
FIG. 7 is a section view taken along line 7—7 of FIG. 6.
Figure 8:
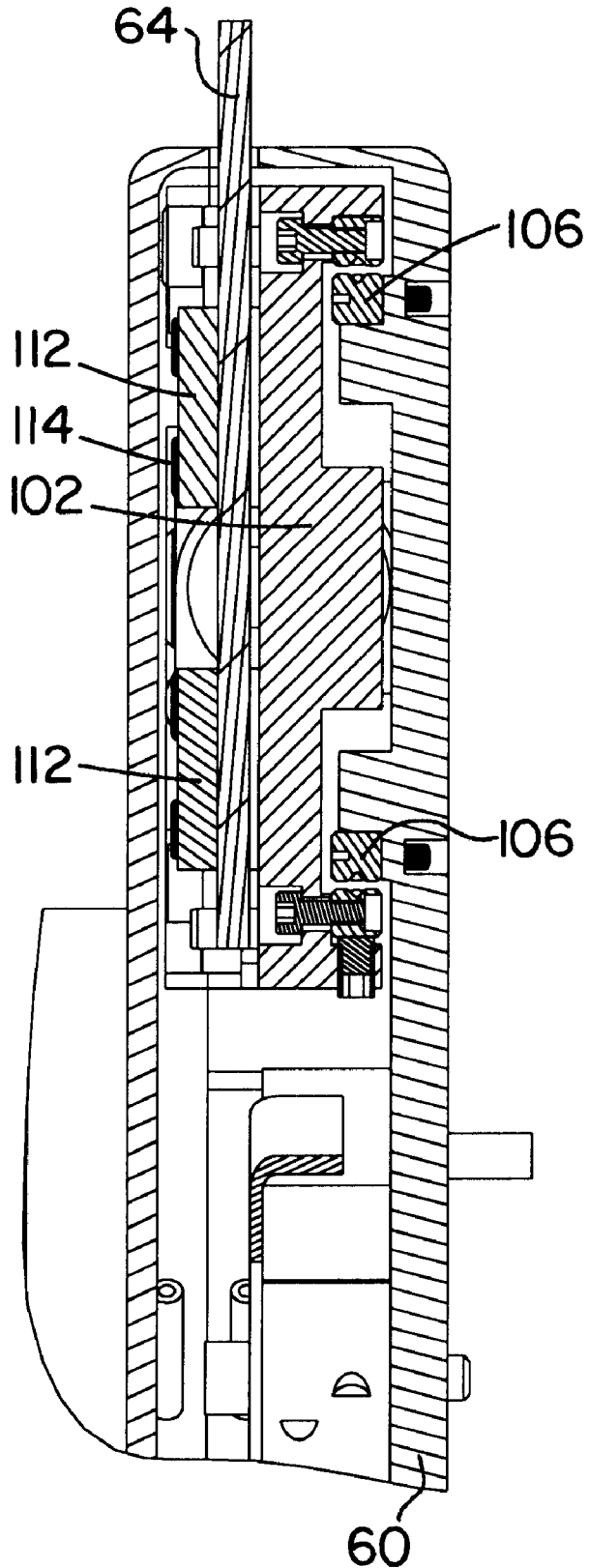
FIG. 8 is a section view taken along line 8—8 of FIG. 6.

Referring to FIGS. 5 and 6, a first micro-switch 110 is closed when the linkage 94 and arms 62 and 64 are fully open. This indicates to the controller that the arms are positioned as shown in FIG. 9, so that they are ready to pick up a workpiece. A second micro-switch 108 detects an inward arm movement limit condition, when the cross arm 96 contacts the switch 108. The switch 108 detects an over position movement, indicating that the arms 62 and 64 are too close together to be picking up or holding a workpiece 35.

The actuator 92 may be replaced by a spring mounted stepper motor actuator. In this alternative design, the arms move together or close until the spring is compressed by a predetermined distance. This provides a secure centered grip on the workpiece.

Figure 12:
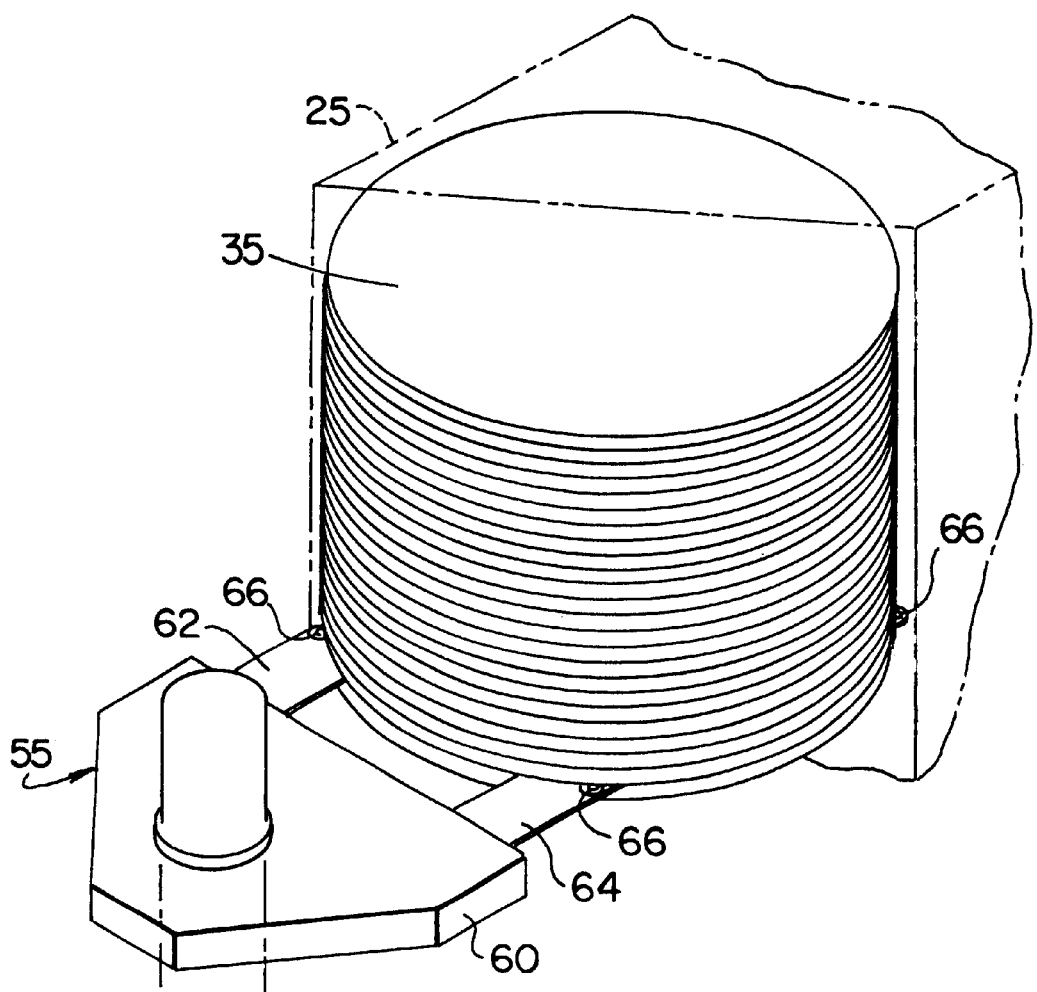
FIG. 12 is a perspective view showing the end effector of FIGS. 5–8 picking up a workpiece from an array of workpieces within a container.

As shown in FIG. 12, the arms 62 and 64 and inserts 66 have a low profile, allowing the end effector 55 to pick up a workpiece in the middle of an array of workpieces within a container 25. The arms 62 and 64 are preferably ceramic, so that they have minimal bending deflection. The mapping sensor 120 has an optical emitter and sensor directed out of the back end of the housing 60 (opposite from the arms 62 and 64). The cylinder robot 78 moves the end effector 55, with the arms 62 and 64 facing away from the workpieces, and with the back end of the housing 60 facing the workpieces, to allow the mapping sensor 120 to scan workpieces in the carriers 48, or in the containers 25. The mapping sensor 120 is electrically connected via the line 90 to the system controller/computer, for optically detecting incorrectly placed workpieces.

Thus, a novel robot for an automated process system has been shown and described. Of course, many changes, modifications and substitutions may be made, without departing from the spirit and scope of the invention. The invention, therefore, should not be limited, except by the following claims and their equivalents.

What is claimed is:

1. An automated workpiece processing system comprising:
   a transfer station;
   a transfer robot at the transfer station, with the transfer robot having an end effector including first and second arms, and a first pair of spaced apart contactors on the first arm and a second pair of spaced apart contactors on the second arm; and
   an actuator for moving the first and second arms laterally together and apart, to engage and disengage edges of a workpiece with the first and second pairs of contactors;
   with the first and second pairs of contactors arranged such that portions of the workpiece extend laterally beyond a top surface of the first and second arms when the workpiece is engaged by the first and second pairs of contactors.

2. The system of claim 1 where the first and second arms are parallel to each other.

3. The system of claim 1 where the contactors are arranged at the corners of a square when they contact the workpiece.

4. The system of claim 1 with the contactors further comprising means for detecting presence of a workpiece at the contactors.

5. The system of claim 4 wherein the means for detecting includes a capacitance sensor.

6. The system of claim 1 with the end effector including a housing and further comprising a workpiece mapping sensor on the housing opposite from the first and second arms.

7. The system of claim 1 wherein the actuator comprises a parallel movement linkage attached to the first and second arms.

8. The system of claim 1 wherein each of the contactors includes a groove therein for engaging an edge of a flat workpiece.

9. The system of claim 1 wherein at least one contactor includes an electrically conductive material for detecting a change of capacitance when a workpiece edge contacts the contactor.

10. The system of claim 1 wherein a portion of the circular workpiece extends beyond a distal end of each of the first and second arms when the workpiece is engaged by the first and second pairs of contactors.

11. The system of claim 1 with at least one of the contactors including detecting means for detecting presence of a wafer.

12. The system of claim 1 wherein the first pair of contactors are spaced apart by a distance less than one diameter of the workpiece.

13. An end effector for a robot in an automated processing system, comprising:
   a first arm having a first contactor and a second contactor on a top surface thereof, with the first and second contactors spaced apart from one another, and with each of the first and second contactors including a groove therein for engaging an edge of a flat workpiece;
   a second arm having a third contactor and a fourth contactor on a top surface thereof, with the third and fourth contactors spaced apart from one another, and with each of the third and fourth contactors including a groove therein for engaging the edge of the flat workpiece; and
   an actuator linked to the first and second arms for moving the first and second arms toward each other to engage the edge of the flat workpiece in the grooves of the first, second, third, and fourth contactors, and away from each other to disengage the edge of the flat workpiece from the grooves of the first, second, third, and fourth contactors.

14. The system of claim 13 wherein the first and second arms are parallel to one another.

15. The system of claim 13 wherein the first, second, third, and fourth contactors are arranged at the corners of a square when they engage the workpiece, such that portions of a circular workpiece extend laterally beyond the contactors and the first and second arms.

16. The system of claim 13 wherein at least one of the first, second, third, and fourth contactors includes a means for detecting presence of a workpiece at the contactors.

17. The system of claim 16 wherein the means for detecting includes a capacitance sensor.

18. A method of engaging a flat circular workpiece, comprising the steps of:
   positioning a first arm, having a first pair of contactors thereon, on a first side of the workpiece;
   positioning a second arm, having a second pair of contactors thereon, on a second side of the workpiece, such that each of the contactors is spaced apart from an edge of the workpiece by a substantially equal distance; and moving the first and second arms toward each other until grooves in the first and second pairs of contactors engage the edge of the workpiece, such that portions of the circular workpiece extend laterally beyond the first and second pairs of contactors and the first and second arms.

19. An automated wafer handling system, comprising:

a transfer robot at a transfer station with the transfer robot having an end effector including first and second arms, and a first pair of spaced apart contactors on the first arm and a second pair of spaced apart contactors on the second arm;

an actuator for moving the first and second arms relatively together and apart to engage and separate from circumferential edges of the wafer with the first and second pairs of contactors; and means for engaging the circumferential edges of the wafers only at the four contactors.

* * * * *